United States Patent [19]

Liu

[11] Patent Number: 5,123,680

[45] Date of Patent: Jun. 23, 1992

[54] FASTENING DEVICE FOR CONNECTING THE FRONT PANEL TO A COMPUTER CASING

[75] Inventor: Morgan C. Liu, Taoyuan, Taiwan

[73] Assignee: Enlight Corporation, Taoyuan, Taiwan

[21] Appl. No.: 655,659

[22] Filed: Feb. 14, 1991

[51] Int. Cl.⁵ .......................... E05C 19/06; G06F 1/00
[52] U.S. Cl. ..................................... 292/17; 364/708; 24/625
[58] Field of Search .................. 24/625, 453; 364/708; 292/17, 19, 76

[56] References Cited

U.S. PATENT DOCUMENTS

| | | | |
|---|---|---|---|
| 842,304 | 1/1907 | Deming | 292/17 |
| 2,398,573 | 4/1946 | Becker | 292/17 X |
| 2,703,428 | 3/1955 | Redmond et al. | 24/625 X |
| 3,148,433 | 9/1964 | Carriker | 292/17 X |
| 4,674,703 | 6/1987 | Falk | 24/625 X |
| 4,742,478 | 5/1988 | Nigro, Jr. et al. | 364/708 |
| 4,973,212 | 11/1990 | Jacobs | 24/453 X |

*Primary Examiner*—Richard E. Moore
*Attorney, Agent, or Firm*—Ladas & Parry

[57] ABSTRACT

A fastening device comprising a fastener having a base fixed on the front panel of a computer casing and a plurality of resilient legs hanging therefrom. Each of the resilient legs has an outward convex foot formed on the end thereof so that when the fastener is pushed into a retaining hole formed on the computer casing to connect the front panel to the computer casing, the feet of the fastener are slightly and temporarily pushed inward when passing through the retaining hole and then spring back to retain the fastener in position when completely passing the retaining hole.

1 Claim, 2 Drawing Sheets

FASTENING DEVICE FOR CONNECTING THE FRONT PANEL TO A COMPUTER CASING

FIELD OF THE INVENTION

The present invention relates generally to a fastening device for connecting the front panel of a computer casing to the casing with a plurality of fasteners disposed thereon and in particular to one for connecting the front panel with a plurality of fasteners comprising resilient retaining legs so as to make the assembly and disassembly of the panel simple and efficient.

BACKGROUND OF THE INVENTION

Conventionally, a personal computer casing has a front panel integrated therewith and several openings are made on the front panel for the installation of disk drivers, keyboard locating device, indicators, buttons, etc. Since the front panel is an integrated part of the casing, each time a drive or a button is broken, the whole casing must be disassembled and removed to have the broken parts reached and fixed.

SUMMARY OF THE INVENTION

It is therefore an object of the present invention to provide a fastening device for efficiently and quickly disassembling and assembling the front panel from a personal computer casing with fasteners having resilient retaining legs disengaging and engaging with the retaining seats formed on the casing.

It is another object of the present invention to provide a fastening device for efficiently and quickly disassembling and assembling the front panel from a personal computer casing so as to provide an easier and simpler way to reach and maintain the disk drivers of the computer.

To achieve the objects, there is provided a fastening device comprising a base which is attached to the front panel of a computer casing with any known means and a plurality of resilient legs hanging therefrom. The end of a resilient leg is bent outward and then inward to form an outward convex foot. Associated with each of the fasteners and formed on the casing body is a retaining seat to receive the legs therein. A retaining seat is generally a hole having a diameter about the size of the legs but smaller than that of the feet so that when a fastener is forced through a retaining seat, the feet thereof will be forced inward to pass the retaining seat and then spring outward back to the original locations thereof to retain the fastener in the retaining seat.

The objects and other aspects and advantages of the invention will become apparent from the following detailed description of the preferred embodiment, reference being made to the accompanying drawings.

DETAILED DESCRIPTION OF THE PREFERRED EMBODIMENT

Figure 1:
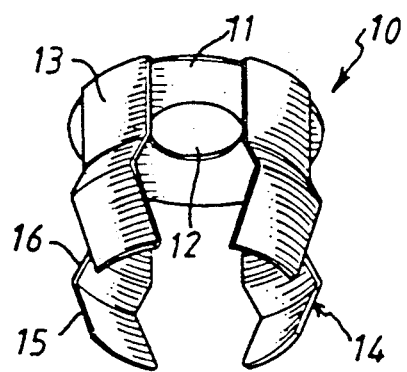
FIG. 1 is a perspective view of the fastener in accordance with the invention.
Figure 2:
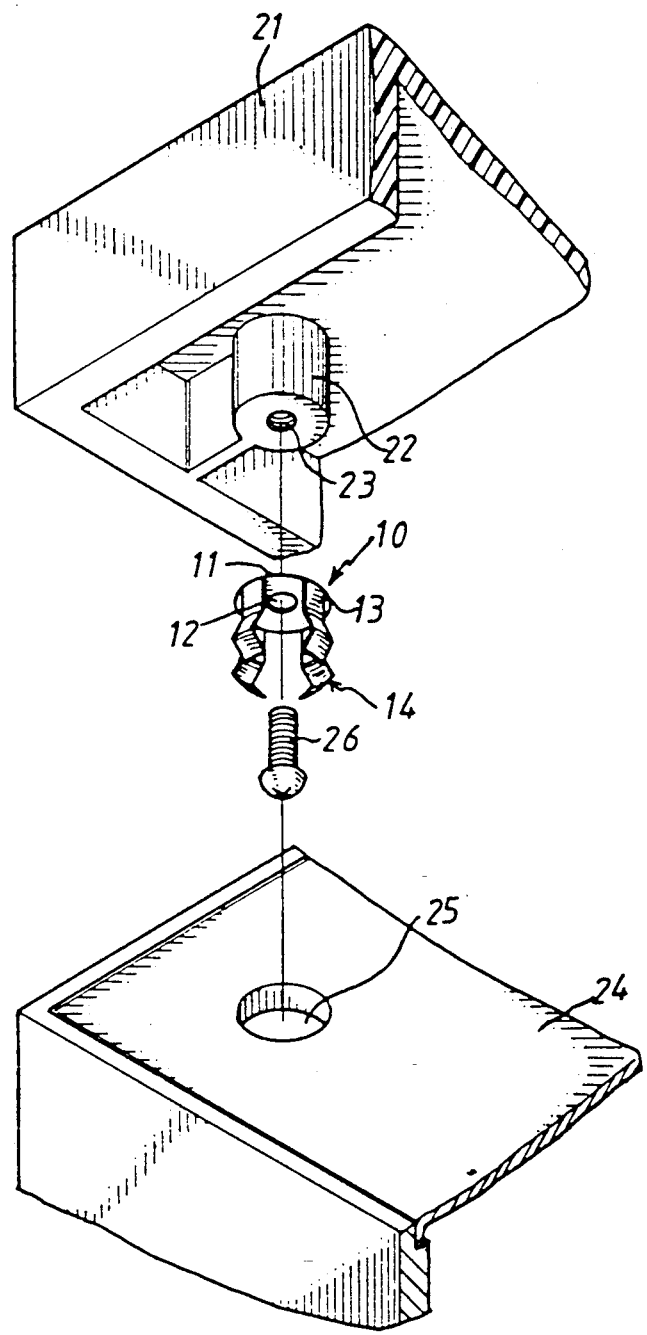
FIG. 2 is a fragmental view showing the installation of the fastener shown in FIG. 1.

With reference to FIGS. 1 and 2, a fastening device in accordance with the present invention, which is generally disposed at each corner of a computer casing comprising a front panel 21 and a casing body 24, comprises a fastener 10 and a retaining seat 25 which is generally an opening, such as a circular hole, formed on the casing body 24. The fastener 10 is an annular base plate 11 with a plurality of resilient legs 13 hanging therefrom. The legs 13 are preferably symmetrically disposed. Each of the legs 13 has on the end thereof, a foot 14 which is formed by bending the end of the leg 13 outward and then inward to make it outward convex, constituted by two inclined surfaces 15 and 16.

The fastener 10 is disposed at a suitable location of the front panel 21 corresponding to the location of the associated retaining seat 25 formed on the casing body 24. The fastener 10 is fixed on the front panel 21 with any known means, for example a screw 26 which passes through a hole 12 formed on the base plate 11 of the fastener 10 and engages with a threaded hole 23 formed on a support 22 fixed on the front panel 21. It is obvious to those skilled in the art that the fastener 10 can also be attached to the support 22 with any other suitable means.

Figure 3:
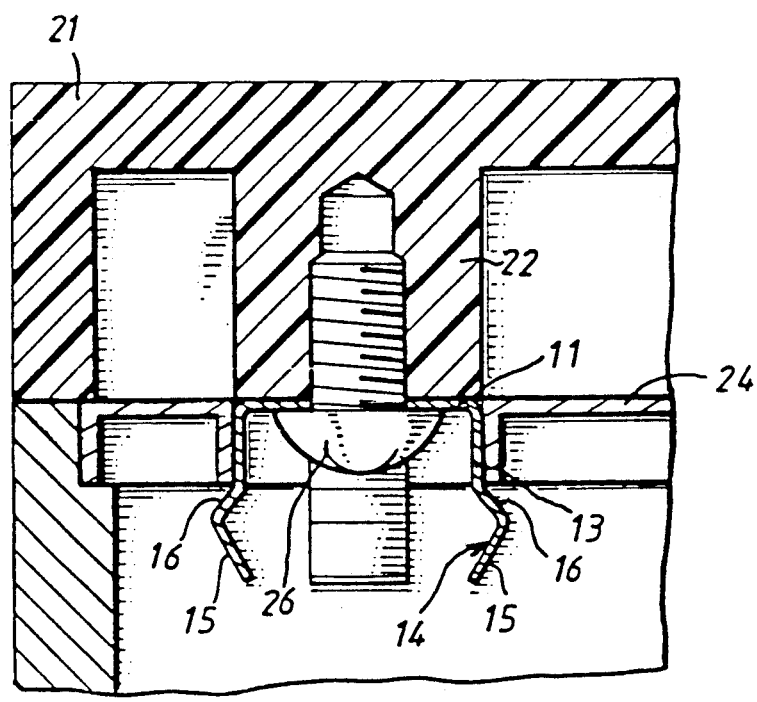
FIG. 3 is a broken view showing how the fastener shown in FIG. 1 engages with the retaining seat associated therewith.

With reference to FIG. 3, when the front panel 21 is assembled to the casing body 24, each of the fasteners 10 is forced to enter the retaining hole 25 associated therewith. Since the diameter of the retaining hole 25 is smaller than that of the feet 14 of a fastener 10, when the feet 14 pass the retaining hole 25, the feet 14 are temporarily pushed inward with the aid of the inclined surfaces 15 thereof. An due to the resilience of the legs 13, the feet 14 will spring back to their original locations when they completely enter the retaining hole 25, and thus retaining the fasteners 10 in position. When the front panel 21 is forcibly pulled the feet 14 of each of the fasteners 10 are inward pushed with the aid of the inclined surfaces 16 and then disengage with the associated retaining hole 25 to complete the disassembly.

It is apparent that although the invention has been described in connection with the preferred embodiment, it is contemplated that those skilled in the art may make changes to certain features of the preferred embodiment without altering the overall basic function and concept of the invention as defined in the appended claims.

What is claimed is:

1. In a computer having a casing, a front panel, and fastening means for physically connecting the casing and front panel, an improvement of the fastening means, comprising:

an annular base having an outermost periphery and a central opening;

corresponding, resilient legs hanging from the outermost periphery of the annular base, whereby to project normally from the annular base in one direction, the legs being spaced from each other circumferentially about the outermost periphery of the annular base, each leg having a first portion connected at one end to the outermost periphery of the annular base, whereby to maintain the diameter of the annular base in the hanging projection of the legs therefrom, a second portion connected at a first end to another end of the first portion opposite the one end of the first portion, the second portion being inclined radially outwardly from the first end thereof to a second end of the second portion that is opposite the first end thereof, and a third portion that is connected at an end to the second end of the second portion and inclined radially inward from the second end of the second portion, whereby the second and third portion of each leg forms an outwardly convex foot;

fixing means comprising a screw, whereby to have a head that has a larger diameter than the central opening of the annular base but a smaller diameter than the outermost periphery of the annular base and a shank projecting from the head for projecting through the central opening of the annular base into one of the casing and front panel to hold the annular base to the one thereof substantially rigidly radially and longitudinally; and a retaining-seat opening in the other of the casing and front panel, the retaining-seat opening having first and second opposite ends and sides therebetween, whereby when the sides have substantially the same diameter as the outermost periphery of the annular base, the inclines of the third portions of the legs push the legs radially inwardly as the legs are moved axially into the retaining-seat opening until their second ends of the second portions pass through the retaining-seat opening between the ends thereof, the resilience and inclines of the second portions of the legs then permitting the first portions of the legs to expand radially outwardly against the sides of the retaining-seat opening, and the first portions of the legs and the fixing means hold the casing and front panel to each other fixedly radially of the annular base, and when the retaining-seat opening has substantially the same length between the first and second ends thereof as is between the ends of the first portions of the legs, the fixing means and the inclines of the second portions of the legs hold the casing and front panel to each other fixedly longitudinally, the resilience of the legs also permitting the casing and front panel to be detached.

* * * * *